United States Patent [19]

Miller

[11] 4,107,721
[45] Aug. 15, 1978

[54] PHOTOTRANSISTOR

[75] Inventor: Gabriel Lorimer Miller, Westfield, N.J.

[73] Assignee: Bell Telephone Laboratories, Incorporated, Murray Hill, N.J.

[21] Appl. No.: 762,675

[22] Filed: Jan. 26, 1977

[51] Int. Cl.² ............................................. H01L 27/14
[52] U.S. Cl. ....................................... 357/30; 357/13; 357/34; 357/58
[58] Field of Search ........................ 357/30, 58, 13, 34

[56] References Cited

U.S. PATENT DOCUMENTS

| 3,529,217 | 9/1970 | Van Santen | 317/235 |
|---|---|---|---|
| 3,532,945 | 10/1970 | Weckler | 317/235 |
| 3,675,025 | 7/1972 | Feldman | 250/211 J |
| 3,697,833 | 10/1972 | Nakata | 317/235 R |
| 3,745,424 | 7/1973 | Ohuchi | 317/235 R |
| 3,755,721 | 8/1973 | Frohman-Bentchkowsky | 317/235 R |

Primary Examiner—Martin H. Edlow
Attorney, Agent, or Firm—Richard D. Laumann

[57] ABSTRACT

A phototransistor is operated with a floating base but with the transistor operating point defined by prebiasing the base, typically by injecting the base current through a prebias emitter in the collector region outside of the depletion layer. The phototransistor has a signal to noise ratio comparable to those of optimized avalanche photodiodes but operates at a significantly lower voltage and without need for temperature compensation. The phototransistor is especially well-suited for optical communications at high data rates.

4 Claims, 3 Drawing Figures

PHOTOTRANSISTOR

BACKGROUND OF THE INVENTION

1. Field of the Invention

This invention relates generally to radiation detectors and more particularly to semiconductor photodetectors having high sensitivity at low light intensity.

2. Description of the Prior Art

The possibilities of increased communications capacity and smaller size, compared to present communications systems, have led to serious consideration of the feasibility of optical communications systems. For the systems presently contemplated using glass transmission lines, a photodetector, necessarily compatible with the specialized size, cost, frequency response and sensitivity requirements imposed by other system components, is needed to convert optical energy into electrical current. Semiconductor radiation detectors appear able to satisfy system requirements imposed on the photodetectors.

In semiconductor radiation detectors, including those sensitive to optical radiation and called photodetectors, the incident radiation interacts with the semiconductor material and creates free charges, i.e., electron-hole pairs, which can provide evidence of the presence of incident radiation when the radiation detector is suitably connected to an external circuit and a current that is proportional to the intensity of the incident radiation flows. Efficient detection of the free charges is facilitated by use of a reverse biased p-n junction. Important features of this junction include an absorption region in which the incident radiation interacts with the semiconductor material and a depletion region having a high electric field formed by immobile positively charged donor atoms and negatively charged acceptor atoms on the $n$ and $p$ sides of the junction, respectively. Photodetectors of this type considered for optical communications use include p-i-n photodiodes, avalanche photodiodes and phototransistors.

All prior art devices of the above types have drawbacks for optical communications use. Optical transmission lines carry light of low intensity and the current from a p-i-n photodiode is correspondingly small and requires amplification which, because of the thermal noise necessarily associated with the amplifier, severely limits the ultimate sensitivity attainable. An avalanche photodiode eliminates some of this constraint on sensitivity with internal amplification. However, the internal amplification requires both high voltage and either temperature compensation or automatic gain control to prevent the detector output signal from varying with changes in the ambient temperature. Phototransistors have not hitherto been as seriously considered for use in optical communications systems as have p-i-n and avalanche photodiodes because their response times have been thought too slow for the high data rates, e.g., 50 Mbit/sec, contemplated and their high capacitances have been thought to impose too severe a limitation on the attainable noise performance. These limitations have made phototransistors less desirable than either p-i-n or avalanche photodiodes in optical communications systems.

SUMMARY OF THE INVENTION

According to the present invention, a phototransistor with collector, base and emitter regions, operates without a direct base contact (and without the capacitance associated with such a contact) but with the transistor operating point defined by prebiasing the base, typically with a current injected into the transistor through a region, called the prebias emitter, in the collector outside the depletion layer, although other methods such as a subsidiary light emitting diode (LED) can also be used. The phototransistor can operate with voltages as low as 20 volts and an error probability less than $10^{-9}$ at a bit rate of 50 Mbit/sec. This performance can be realized with less than 1000 photons per bit if the base diameter is less than 10 microns which is easily done with present techniques.

DETAILED DESCRIPTION

Figure 1:
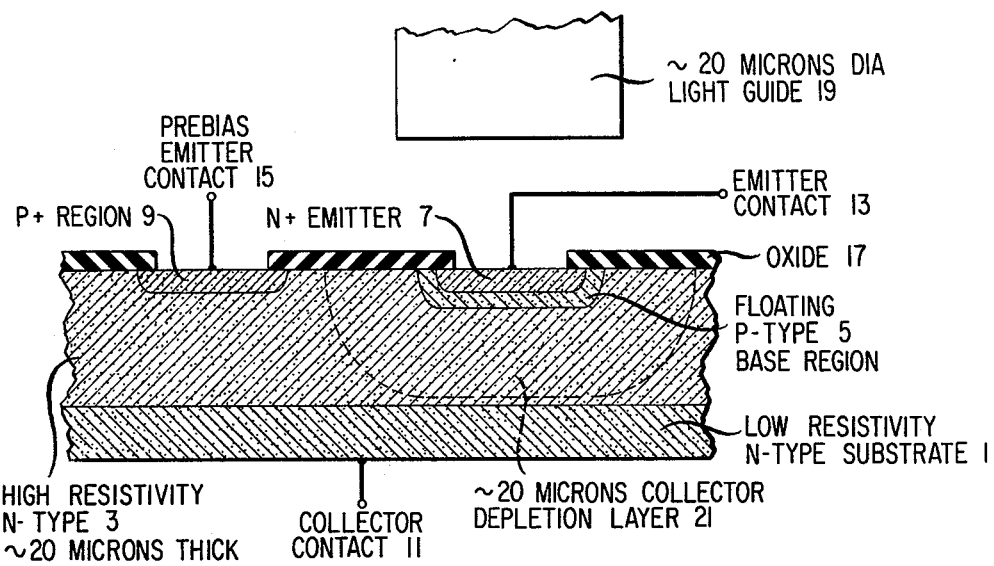
FIG. 1 is a cross section view of one embodiment of the phototransistor.

A cross section of one embodiment of the phototransistor is shown in FIG. 1. A low resistivity n-type substrate 1 is covered by a high resistivity n-type layer 3 that forms the collector. Within layer 3 are a p-type region 5, forming the base, an $n+$ region 7, forming the emitter, and a $p+$ region 9, called the prebias emitter. The prebias emitter is located within several diffusion lengths of the depletion layer, but outside the depletion region 2, present when the junction formed by regions 3 and 5 is reverse-biased. The prebias emitter is a current source for a current flowing to the base. Electrical contacts 11, 13 and 15 are made to the n-type substrate, emitter and prebias emitter, respectively. Except for openings for the desirably light transparent electrical contacts, an oxide layer 17 covers the upper surface of layer 3. During operation of the phototransistor, the end of the optical fiber 19 is positioned close to emitter 7. When the p-n junction formed by regions 3 and 5 is reverse-biased, an essentially hemispherical depletion layer 21 is formed as shown in the collector region.

Figure 2:
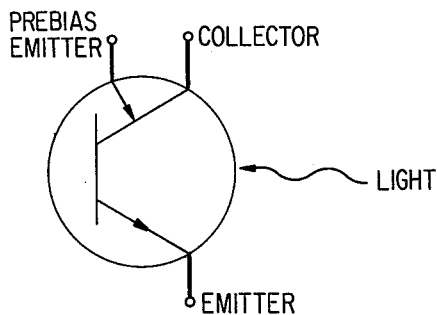
FIG. 2 is a schematic representation of the phototransistor.

A symbol for the phototransistor is shown in FIG. 2.

Phototransistor fabrication may be accomplished with conventional semiconductor device fabrication techniques. For example, an epitaxial layer is grown on substrate 1 and then sequentially covered with layers of silicon oxide and photoresist. Selected areas of the photoresist are exposed and windows opened in the photoresist and underlying oxide layer. The exposed areas of layer 3 are then suitably doped by, e.g., diffusion, to form the base region, etc. Since all of the desired doping cannot generally be done through one set of windows, the sequence of processing steps is generally repeated several times to effect fabrication. The last fabrication step usually is deposition of the electrical contacts of which the emitter contact is desirably transparent to the light transmitted by the optical fiber to optimize the efficiency of the communications system. Any of the conventional semiconductor materials, e.g., silicon, germanium, indium arsenide or other III-V compounds, may be used in the phototransistor although some materials will be preferred to others when the wavelengths of the transmitted light are considered.

As is well known, semiconductor radiation absorption coefficients are functions of both the semiconductor material and the wavelength of the incident radiation. Accordingly, the semiconductor material selected depends upon the wavelength of the radiation transmitted. The material selected, as well as the working voltages and the doping concentrations, determines the sizes of the absorption region and the depletion layer where the radiation is desirably absorbed to obtain a rapid response from the phototransistor. For a phototransistor made of Si, typical doping levels are $10^{16}/cm^3$ for the substrate, $6 \times 10^{13}/cm^3$ for the epitaxial layer, $10^{17}/cm^3$ for the base, $10^{19}/cm^3$ for the emitter and $10^{16}/cm^3$ for the prebias emitter.

While the operation of the described phototransistor is basically the same as that of conventional phototransistors operating either with a floating base or with the transistor operating point defined by a direct electrical contact to the base, it differs in the essential aspect of having the operating point defined without a direct base contact but with contactless means. These means may comprise a current flowing from the prebias emitter to the base, the embodiment described, or a subsidiary light source, such as a light emitting diode (LED), illuminating the device and generating electron-hole pairs which then determine the transistor operating point. Other light sources are easily thought of. Definition of the operating point by either of these means eliminates the direct base contact which has previously been needed to bias the base and which degrades the error probability or transistor sensitivity because of the capacitance inevitably associated with the base contact.

The photons forming the light pulses propagating through the glass transmission line are desirably absorbed in the collector depletion layer, when the semiconductor material and reverse bias voltage are suitably selected, where they form electron-hole pairs. The holes move to the base and cause the emitter to inject additional electrons in numbers determined by the current gain of the transistor structure. The emitter current provides an indication of the presence of the incident radiation.

For the doping levels in the described embodiment, typical base-emitter capacitances are 0.1 pf for a 10μ emitter aperture and $10^{-3}$ pf for a 1μ emitter aperture. Intermediate size apertures yield intermediate capacitances. 20 volts provides adequate reverse bias and a reasonable charge collection time and a 20μm thickness of Si insures adequate absorption of incident radiation. The prebias emitter is located within a few, desirably less than 5, diffusion lengths of the edge of the collector depletion layer.

The number of photoelectrons needed per time interval, assuming one photoelectron per photon, varies from $10^3$ to $10^2$ for an error probability less than $10^{-9}$ with the smaller number of photoelectrons needed for the smaller aperture. The number of photoelectrons needed is reduced if the requirement on the error probability is relaxed, and increased if the requirement is strengthened.

The phototransistor design described will be better understood if the considerations involved in signal detection are briefly discussed. In any given time interval, signal detection depends upon the presence of sufficient photoelectrons to permit discrimination, by the detection system, between the presence and absence of a signal. Simple detection of electrons is not sufficient to permit such discrimination because noise electrons are always present and there is, therefore, uncertainty because the number of photoelectrons varies from signal to signal, about whether the electrons are photo- or noise electrons and whether a signal is present. This uncertainty, which is usually expressed as an error probability, or the number of times an incorrect determination will be made, can be reduced by designing a detection system that requires fewer photoelectrons for a given error probability, i.e., by designing a photodetector with a higher signal to noise ratio for the same number of incident photons.

The total system noise can be separated into parallel noise and series or thermal (Johnson) noise. With a photodetector operating in the series noise limit, as it normally does, the number of photoelectrons needed per time interval for a given error probability is a multiple of the product of the series noise spectral density, the system capacitance and the square root of the number of bits per time interval. A base contact made to define the transistor operating point inevitably degrades the signal to noise ratio because of the capacitance added by the base contact by defining the transistor operating point without a direct base contact, as applicant does not increase the system capacitance.

The optimum prebias current, i.e., the current from the prebias emitter to the base, may be calculated, assuming an essentially delta function input, as follows. If the base bias current is $I_B$ and the transistor has a low frequency current gain, $\beta$, the emitter current is $I_E = \beta I_B$. The series noise resistance is $$R_s = \frac{1}{2} \frac{K\theta}{q} \frac{1}{\beta I_B}$$

and the parallel noise resistance is $$R_p = \frac{K\theta}{q} \frac{1}{I_B}$$

where $K$ is Boltzmann's constant, $\theta$ is the absolute temperature and $q$ is the electronic charge. It is assumed that the charge collection time is small compared to the bit spacing. The noise corner time constant, i.e., the angular frequency at which the series and parallel noise contributions are equal, is $T_c = C_T \sqrt{R_p R_s}$ where $C_T$ is the total capacitance. If $T_c$ is chosen as $T_B/2$ where $T_B$ is the duration of a single time interval, the optimum prebias current is $$I_B = \frac{K\theta C_T}{T_B q} \sqrt{\frac{12}{\beta}}.$$

As an example, if $C_T = 0.1$ pf, $\beta = 100$ and the bit rate is 50 Mbit/sec., the base current is 40 na and the emitter current is 4 μa. Deviations from the optimum prebias current result in some degradation of system performance and the total noise increases. The normalized mean square noise approximately doubles as the prebias current either increases or decreases by a factor of four from the optimum value. Other choices for $T_c$ cause only small changes in the final signal to noise ratio.

Figure 3:
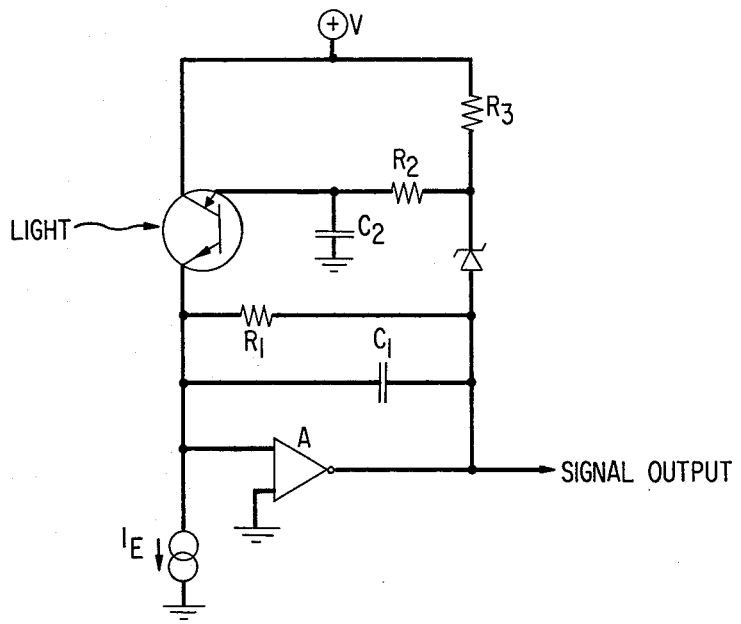
FIG. 3 is a representative circuit used to maintain the desired prebias current.

A simple feedback circuit for maintaining the prebias current at the desired level is shown in FIG. 3. Amplifier A and $R_1C_1$ form a high speed integrator while $R_2C_2$ comprises the low frequency dominant pole that averages over many time slots.

It may be impossible to maintain the prebias condition for very bright light sources, i.e., large numbers of photoelectrons. However, this is not important because the signal to noise ratio will be high for bright sources. The collector region resistivity must be high enough to keep the avalanche gain in the collector region to less than $1/\beta$ to avoid relaxation oscillations. At very low data rates, specially fabricated devices might be necessary to maintain reasonable $\beta$s for emitter currents less than $0.1\mu A$. The phototransistor thus appears more useful, at least with present techniques, for high data or bit rates.

The embodiment shown in FIG. 1 has a single electrical contact, preferably transparent to reduce absorption, to the emitter. Other geometries are possible, although they will typically cause some degradation of the signal to noise ratio. For example, a plurality of strips, physically spaced from each other but with their emitter regions electrically connected, may be employed. The degradation in the signal to noise ratio because of the increased emitter contact area is less than might be initially expected as the only capacitance that degrades the signal to noise ratio is the capacitance of the strip on which charge collects. The larger emitter area permitted by this geometry facilitates alignment of the phototransistor with respect to the optical fiber. However, with more emitter area covered by contacts, use of transparent electrical contacts, such as those made of indium tin oxide, becomes more desirable. Other embodiments, such as dots, are easily thought of.

What is claimed is:

1. An optical radiation detector comprising a substrate of a first conductivity type, first and second regions of a second conductivity type, said first and second regions being disposed within said substrate, a third region of said first conductivity type, said third region being disposed within said second region, said third, second and first regions being called the emitter, base and prebias emitter regions, respectively, said substrate being called the collector region, said collector region having a light sensitive depletion layer when reverse biased, said emitter having an exposed surface providing an optical radiation receiving surface, means for prebiasing said base region; characterized in that said means for prebiasing said base region comprises said prebias emitter in said collector region spaced from said light sensitive depletion layer, said prebias emitter being a current source for supplying a current to said base.

2. An optical radiation detector as recited in claim 1 in which said current to said base region is substantially equal to $((K\theta C_T)/qT_B))\sqrt{12/\beta}$.

3. A radiation detector as recited in claim 1 in which said emitter region has a diameter between 1 micron and 10 microns.

4. A radiation detector as recited in claim 1 in which said prebias emitter is spaced less than 5 mircons from said depletion layer.

* * * * *